United States Patent
Ge et al.

(10) Patent No.: US 8,638,153 B2
(45) Date of Patent: Jan. 28, 2014

(54) PULSE CLOCK GENERATION LOGIC WITH BUILT-IN LEVEL SHIFTER AND PROGRAMMABLE RISING EDGE AND PULSE WIDTH

(75) Inventors: Shaoping Ge, Raleigh, NC (US); Chiaming Chai, Chapel Hill, NC (US); Stephen Edward Liles, Apex, NC (US); Lam V. Nguyen, Santa Clara, CA (US); Jeffrey Herbert Fischer, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 36 days.

(21) Appl. No.: 13/433,891

(22) Filed: Mar. 29, 2012

(65) Prior Publication Data

US 2013/0257498 A1    Oct. 3, 2013

(51) Int. Cl.
*H03K 3/00* (2006.01)

(52) U.S. Cl.
USPC ............ 327/291; 327/172; 327/293; 327/298

(58) Field of Classification Search
None
See application file for complete search history.

(56) References Cited

U.S. PATENT DOCUMENTS

| | | | |
|---|---|---|---|
| 5,027,323 A | 6/1991 | Miyamoto et al. | |
| 6,072,348 A * | 6/2000 | New et al. | 327/295 |
| 6,850,460 B1 | 2/2005 | Chan et al. | |
| 6,975,154 B1 * | 12/2005 | Pedersen | 327/295 |
| 7,180,353 B2 | 2/2007 | Chiu et al. | |
| 7,609,583 B2 | 10/2009 | Booth et al. | |
| 2010/0148839 A1 | 6/2010 | Chai et al. | |
| 2010/0195379 A1 | 8/2010 | Rao et al. | |

OTHER PUBLICATIONS

BK Precission: "4033 & 4034 Programmable Pulse Generators", Apr. 4, 2011, XP002699916, Retrieved from the Internet: URL:Http://Web.archive.org/web/20110404090137/http://www.digikey.com/US/EN/PH/BK/403X.html.
International Search Report and Written Opinion—PCT/US2013/034414—ISA/EPO—Aug. 16, 2013.

* cited by examiner

*Primary Examiner* — An Luu
(74) *Attorney, Agent, or Firm* — Peter Michael Kamarchik; Nicholas J. Pauley; Joseph Agusta

(57) ABSTRACT

Systems and methods for generating pulse clocks with programmable edges and pulse widths configured for varying requirements of different memory access operations. A pulse clock generation circuit includes a selective delay logic to provide a programmable rising edge delay of the pulse clock, a selective pulse width widening logic to provide a programmable pulse width of the pulse clock, and a built-in level shifter for shifting a voltage level of the pulse clock. A rising edge delay for a read operation is programmed to correspond to an expected read array access delay, and the pulse width for a write operation is programmed to be wider than the pulse width for a read operation.

21 Claims, 6 Drawing Sheets

Conventional 6T SRAM

PULSE CLOCK GENERATION LOGIC WITH BUILT-IN LEVEL SHIFTER AND PROGRAMMABLE RISING EDGE AND PULSE WIDTH

FIELD OF DISCLOSURE

Disclosed embodiments generally relate to pulse clock generation. More particularly, exemplary embodiments are directed to generating pulse clocks with programmable edges and pulse widths configured for varying requirements of different memory access operations.

BACKGROUND

Growing demands for extended battery life and high processing speeds in the handheld device and mobile phone industries have created a corresponding need for low power and high performance memory systems. In order to conserve power, on-chip memory is restricted to low supply voltage levels.

However, conventional memory cells such as 6 Transistor Static Random Access Memory (6T-SRAM) are not capable of operating at very low voltages. A common solution involves the use of multiple voltage domains, such that memory cells may be operated at a relatively high voltage level while other on-chip logic may be operated at lower voltages. In order to achieve multiple voltage domains, level shifters are commonly used to convert low voltage to high voltage and vice versa as needed. However, level shifters introduce latency, which may be undesirable in timing critical paths.

In the case of memory systems comprising large arrays of memory cells, locally generated self-timed pulse clocks are often utilized to overcome the effects of device variations (e.g. due to process variations). These pulse clocks may be subjected to conflicting needs for different memory access operations. For example, during a memory read operation it may be desirable for the rising edge of the pulse clock to arrive as fast as possible at memory cells of the memory array being accessed, in order to enable quick read access. Moreover, during the memory read operation it may be desirable for the pulse width of the pulse clock to be narrow, in order to reduce power consumption by disallowing full voltage swings on bit lines.

On the other hand, memory write operations are usually not timing critical, and thus can tolerate higher arrival delays in the rising edge of the pulse clock. In fact, memory write operations may benefit from delays in the pulse clock so as to allow sufficient set-up time for the data written. In further contrast to read operations, during write operations it may be desirable for the pulse width of the pulse clock to be wider to allow for sufficient write time in order to guarantee successful completion of the write operations, especially at lower supply voltage levels. Conventional pulse clock implementations are not well suited to meet these conflicting needs for read and write operations on memory cells.

Accordingly, there is a need in the art for solutions which avoid the aforementioned problems associated with level shifters and pulse clocks.

SUMMARY

Exemplary embodiments of the invention are directed to systems and methods for generating pulse clocks with programmable edges and pulse widths configured for varying requirements of different memory access operations.

For example, an exemplary embodiment is directed to a method for generating a pulse clock comprising: configuring a programmable rising edge delay of the pulse clock; configuring a programmable pulse width of the pulse clock; configuring a level shifter for shifting a voltage level of the pulse clock; and generating the pulse clock in accordance with the programmed rising edge delay, programmed pulse width, and shifted voltage level.

Another exemplary embodiment is directed to a pulse clock generation circuit comprising: a selective delay logic to provide a programmable rising edge delay of the pulse clock; a selective pulse width widening logic to provide a programmable pulse width of the pulse clock; a built-in level shifter configured to shift a voltage level of the pulse clock; and logic configured to generate the pulse clock in accordance with the programmed rising edge delay, programmed pulse width, and shifted voltage level.

Yet another exemplary embodiment is directed to a pulse clock generation system for generating a pulse clock, the pulse clock generation system comprising: a selective delay means for providing a programmable rising edge delay of the pulse clock; a selective pulse width widening means for providing a programmable pulse width of the pulse clock; a built-in level shifting means for shifting a voltage level of the pulse clock; and means for generating the pulse clock in accordance with the programmed rising edge delay, programmed pulse width, and shifted voltage level.

Yet another exemplary embodiment is directed to non-transitory computer-readable storage medium comprising code, which, when executed by a processor, causes the processor to perform operations for programming a pulse clock generator, the non-transitory computer-readable storage medium comprising: code for configuring a programmable rising edge delay of the pulse clock; code for configuring a programmable pulse width of the pulse clock; code for configuring a level shifter for shifting a voltage level of the pulse clock; and code for generating the pulse clock in accordance with the programmed rising edge delay, programmed pulse width, and shifted voltage level.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
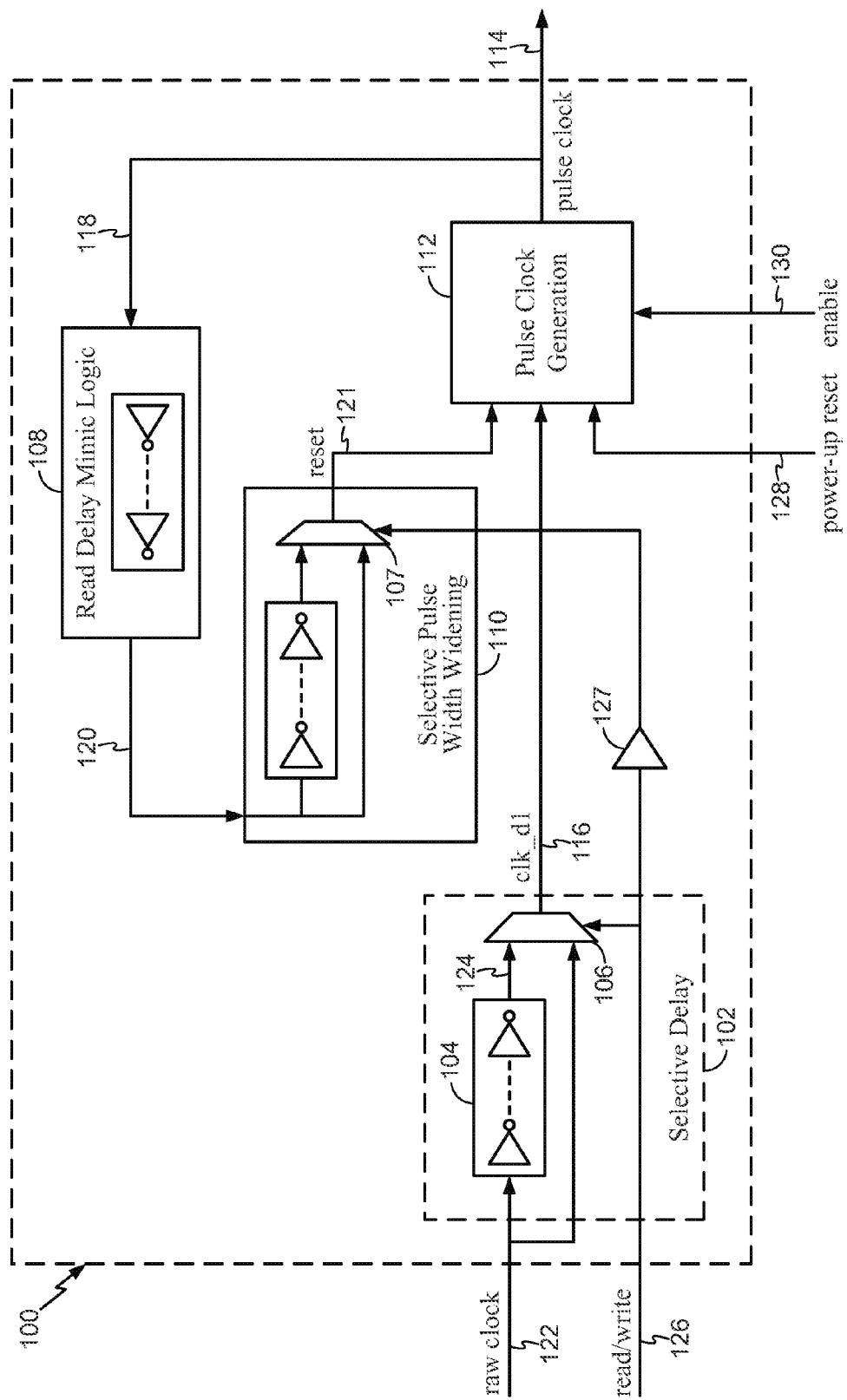
FIG. 1 illustrates a schematic representation of self-timed pulse clock generation circuit 100 configured according to exemplary embodiments.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments are directed to self-timed pulse clock generation circuits configured for programmable pulse width and rising edge delays in order to meet conflicting requirements of read and write operations. Further, exemplary embodiments may include a built-in level shifter configured to convert a raw clock in a low voltage domain to pulse clocks for read and write operations in high voltage domain without introducing additional delays from a separate voltage level shifter, while also preventing glitches and charge sharing problems which may occur in conventional implementations.

With reference now to FIG. 1, self-timed pulse clock generation circuit 100 configured according to exemplary embodiments is illustrated. Raw clock 122 may be input to self-timed pulse clock generation circuit 100, and may serve as a base clock for generating customized clock pulses for read and write operations. Raw clock 122 may be generated by known techniques such as by the use of piezoelectric crystals, etc. Raw clock 122 may be made available at a low voltage level or may be derived from a low voltage domain.

Raw clock 122 may first enter selective delay logic 102, wherein raw clock 122 may be delayed selectively for write operations. Programmable delay logic 104, read/write control 126 and selector 106 may be configured as shown for selectively delaying raw clock 122. In one example, if a read operation is indicated by read/write control 126, then raw clock 122 may be selected by selector 106 to form the selectively delayed output clock clk_d1 116. On the other hand, if read/write control 126 indicates a write operation, then programmable delay logic 104 may delay raw clock 122 by a desired amount and generate a delayed clock 124, which may then be selected by selector 106 to form the selectively delayed output clock clk_d1 116. Programmable delay logic 104 may be implemented by known techniques, such as, by controlling a number of inverters or buffer elements to be coupled in series. Effective sizes of these inverters or buffer elements may also be controlled to adjust the delay amount. Skilled persons will recognize suitable implementations for programmable delay logic 104.

The selectively delayed output clock, clk_d1 116, thus generated, may then enter pulse clock generation logic 112. Pulse clock generation logic 112 may ultimately output pulse clock 114 which meets above-noted requirements for read and write operations in exemplary embodiments. Pulse clock generation logic 112 may include logic for voltage level shifting, such that output pulse clock 114 is made available at a high voltage level without introducing unwanted latency from a separate voltage level shifter. Further, pulse clock generation logic 112 may be configured to eliminate glitches in output pulse clock 114. Feedback path 118 from output pulse clock 114 back to pulse clock generation logic 112 through reset 121 may include read delay mimic logic 108 and selective pulse width widening logic 110 as shown. Feedback path 118 may provide a self-resetting and thus self-timing functionality to pulse clock generation logic 112. Pulse clock generation logic 112, read delay mimic logic 108, and selective pulse width widening logic 110 will now be described in further detail.

Figure 2:
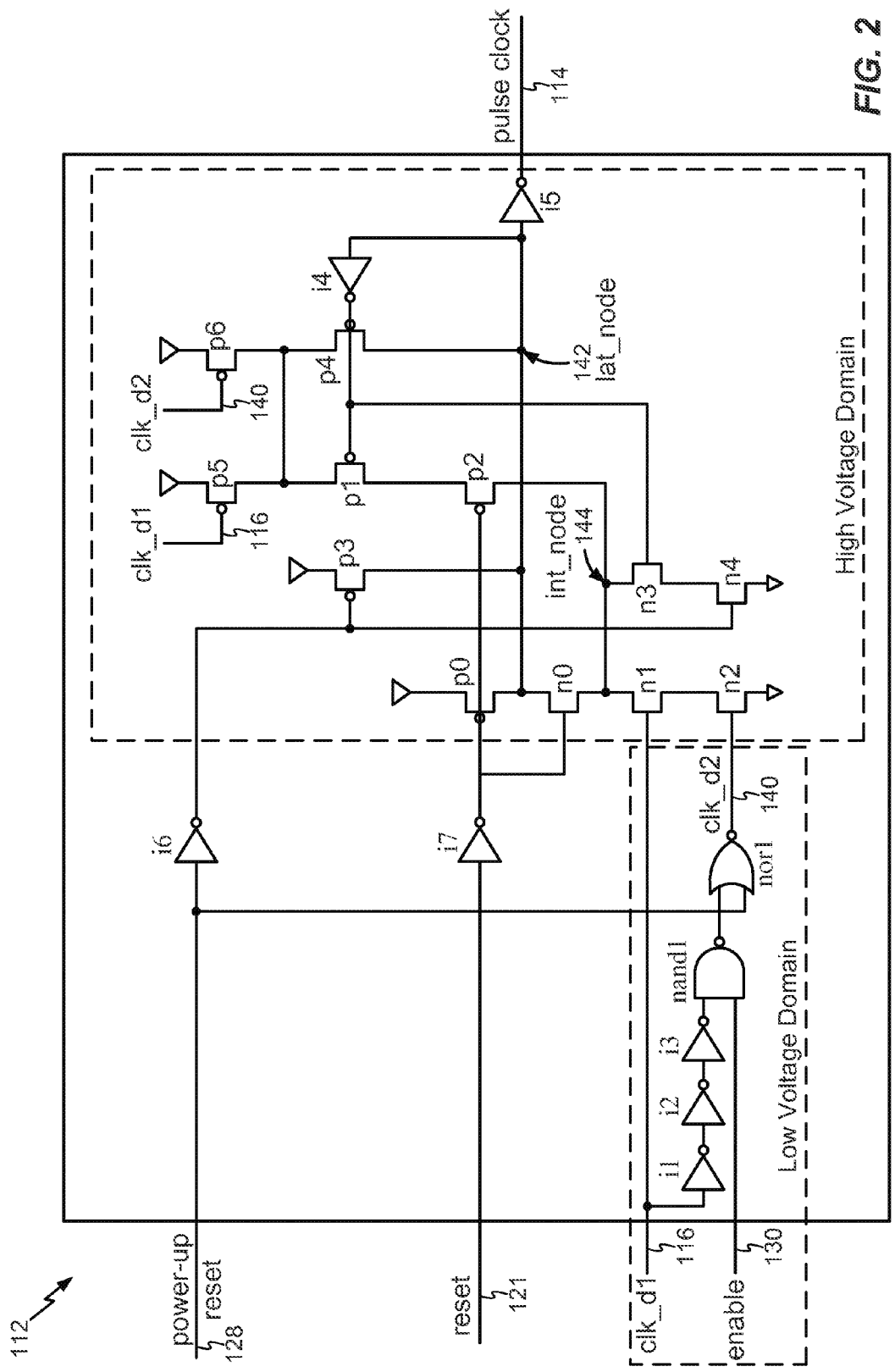
FIG. 2 illustrates a transistor-level schematic view of pulse clock generation logic 112 of the self-timed pulse clock generation circuit 100 of FIG. 1.

With reference now to FIG. 2, an expanded view of pulse clock generation logic 112 is provided, which includes a transistor-level schematic. Enable 130 and power-up reset 128 are input to clock generation logic 112 from an external source (not shown) to enable or reset the output pulse clock 114. An exemplary operation of pulse clock generation logic 112 will now be described. Initially, power-up reset 128 is driven high, thus causing the output of inverter i6 to be driven low and triggering pull-up transistor p3 to pull up lat_node 142 and thereby driving output pulse clock 114 low via inverter i5. It will be observed that pull-up transistor p3 is in the high voltage domain, as indicated in FIG. 2. Thus, output pulse clock 114 is derived in the high voltage domain.

Thereafter, power-up reset 128 is driven low and enable 130 is driven high. The selectively delayed output clock, clk_d1 116 traverses through inverters i1, i2, and i3, and thus the output of i3 presents an inverted and delayed pulse following clk_d1. At the point when the output of i3 also rises, both inputs to nand1, i.e. the output of i3 and enable 130 are high, thus causing the output of nand1 to be low. This in turn means both inputs of nor1, i.e. the output of nand1 and the power-up reset 128 are low, and thus, node clk_d2 140 is driven high, thereby turning on pull-down transistor n2. Further, pull-down transistor n4 will now be turned on because the output of inverter i6 will be driven high.

A first instance of a rising edge of raw clock 122 will now be considered. It will be recalled that the selectively delayed output clock clk_d1 116 is a selectively delayed version of raw clock 122. Both raw clock 122 and selectively delayed output clock clk_d1 116 may be in the low voltage domain. Thus, a rising edge of raw clock 122 may cause a rising edge of selectively delayed output clock clk_d1 116 after a delay, and then turn on pull-down transistor n1. At this instance in time pull-down transistor n3 will remain turned off. It will be noticed from FIG. 2 that selectively delayed output clock clk_d1 116 is coupled to the gate of pull-up transistor p5 and node clk_d2 140 is coupled to the gate of transistor p6. Accordingly, pull-up transistors p5 and p6 will be partially turned off, because the source voltages of pull-up transistors p5 and p6 are in the high voltage domain and their gate voltages are in the low voltage domain; and all four pull-down transistors n0, n1, n2, and n4 will be turned on at this instance. Therefore, both nodes int_node 144 and lat_node 142 will be pulled down and inverter i5 will drive output pulse clock 114 high. During the time that lat_node 142 is being pulled down, pull-down transistor n3 will be turned on, which will provide additional current source to speed up the pull down process of lat_node 142 and int_node 144. It will be recalled that output pulse clock 114 is already in the high voltage domain. Accordingly, the rising edge of raw clock 122 in the low voltage domain creates a rising edge of output pulse clock 114 in the high voltage domain without requiring additional voltage level shifting logic. While pull-up transistors p5 and p6 being turned off halfway may incur minor delay and power consumption costs, these costs may be offset by the additional pull-down path provided by pull-down transistors n3 and n4.

Now, lat_node 142 will remain in the low state and pulse clock 114 will remain in the high state due to the latch created by inverter i4 and the combination of pull-up transistors p4, p6 and pull-down transistors n3, n4, until a reset mechanism returns lat_node 142 to high state, thus driving output pulse clock 114 low. Reset 121, which will be described in further detail below, can control the falling edge of output pulse clock 114. It will be recognized that controlling the time period between the rising edge of output pulse clock 114 and the falling edge of output pulse clock 114 will determine the width of the clock pulse derived at output pulse clock 114.

Returning now to FIG. 1, selective pulse width widening logic 110 may be employed to selectively expand the pulse width between rising and falling edges of output pulse clock 114. Similar to selective delay logic 102, selective pulse width widening logic 110 may employ multiplexor 107 to choose between the input signal without added delays and a delayed version of the input signal, based on read/write control 126. The timing of read/write control 126 may be appropriately adjusted by buffer 127 to account for delays in reaching selective pulse width widening block 110 after passing through selective delay block 102 which was previously discussed. Accordingly, depending on whether the operation is a read or a write, the delay path through selective pulse width widening logic may be controlled, such that the pulse width for write operations is made wider. In other words, output 120 of read delay mimic logic 108 (which will be discussed in further detail below) may be selectively delayed to cause the width of the output of selective pulse width widening logic 110, reset 121 to change. This will control the time it takes for reset 121 to rise from a low to high level and then fall back to the low level.

Once reset 121 falls, a next rising edge of output pulse clock 114 may be generated by repeating the above process. The next falling edge may be suitably delayed for read operations by read delay mimic logic 108. In other words, read delay mimic logic 108 is configured to ultimately delay the falling edge of output pulse clock 114, thus controlling the pulse width. As will be recalled, the rising edge of output pulse clock 114 is controlled by selective delay logic 102.

With combined reference now to FIGS. 1 and 2, feedback path 118 from output pulse clock 114 to reset 121 will now be described. As shown in FIG. 1, this path comprises read delay mimic logic 108 and selective pulse width widening logic 110.

Read delay mimic logic 108 may be included to control the delay in the falling edge of output pulse clock 114 from the rising edge of output pulse clock 114 in order to account for memory array access delays encountered during a read operation. For example, read delay mimic logic 108 may be configured to provide a delay corresponding to the delay which may be incurred in accessing a memory cell in the memory array. Read delay mimic logic may comprise a programmable delay element to match an expected read access delay. Thus, the rising edge of output pulse clock 114 will be delayed by read delay mimic logic 108 to form the rising edge of output 120. In the case of read operations, selective pulse width widening logic 110 will select the input without any delay added and the rising edge of output 120 will essentially appear as the rising edge of reset 121, which is inverted by inverter i7 in pulse clock generation logic 112. With particular reference now to FIG. 2, the inverter formed by pull-up transistor p0 and pull-down transistor n0 will reset lat_node 142 to a high state. In other words, the feedback loop including read mimic delay logic 108 of FIG. 1 will essentially ensure that the falling edge of output pulse clock 114 is made available at a delayed time in the high voltage domain in the case of read operations.

Turning again to the first instance of the rising edge of raw clock 122 after coming out of reset, node clk_d2 140 will fall after the rising edge of selectively delayed output clock clk_d1 116 traverses inverters i1, i2, i3, and nand1 and nor1. This will cause pull-down transistor n2 to be turned off, and also pull-up transistor p6 to be turned on. This will cause lat_node 142 to rise, thus creating the falling edge of output pulse clock 114. At this point in time, pull-down transistor n1 may either be turned on or off, without affecting the latching function of lat_node 142. When the falling edge of selectively delayed output clock clk_d1 116 (after being selectively delayed from the falling edge of raw clock 122) comes through, pull-down transistor n1 will also be turned off, and pull-up transistor p5 will be turned on. Turning off both pull-down transistors n1 and n2 will provide additional leakage power saving through the path comprising pull-down transistors n1 and n2. In the case of write operations, selective pulse width widening logic 110 will selectively introduce an additional delay in the feedback path before reset 121 may be asserted and thus allowing lat_node 142 to rise and create the falling edge of output pulse clock 114. In this manner, write operations will have a wider pulse width. As previously described, a wider pulse width may facilitate write operations by providing additional time for completion of write operations (which as will be recalled, are usually not timing critical).

It will be recognized that turning on both pull-down transistors n1 and n2 is a self-timed process. The time period for which pull-down transistors n1 and n2 are turned on may be determined by the delay through inverters i1, i2, i3, and gates nand1 and nor1. In general, pull-down transistors n1 and n2 will be turned off before reset 121 is de-asserted. Accordingly, in cases where read/write operations require multiple cycles for their completion, a single pulse of enable 130 may be provided during the entire operation, thus ensuring that only a single pulse of output pulse clock 114 is generated for the duration of the entire operation.

Accordingly, it is seen that the rising edge of output pulse clock 114 may be delayed from raw clock 122 by a controllable amount for read operations and write operations. The latch mechanism including inverter i4 and the combination of pull-up transistors p4, p6 and pull-down transistors n3, n4 will hold output pulse clock 114 at a high state until a falling edge is imposed after a controllable time period for read and write operations by asserting signal reset 121.

Now it will be noted that pulse clock generation logic 112 is also configured to avoid glitches and undesirable charge sharing which may occur, for example, between lat_node 142 and int_node 144. When reset 121 changes between high and low state, it will be recognized that lat_node 142 may remain at a high state due to the latch mechanism, but int_node 144 may fall to a low state, thus causing a large voltage differential to occur between drain and source nodes of pull-down transistor n0. This may lead to unwanted charge sharing problems. In order to prevent such problems from arising, int_node 144 may be pulled up to high state using the pull-up transistors p5, p6, p1 and p2. Thus, both lat_node 142 and int_node 144 will be in the high state, and a large differential voltage will no longer affect pull-down transistor n0.

Figure 3:
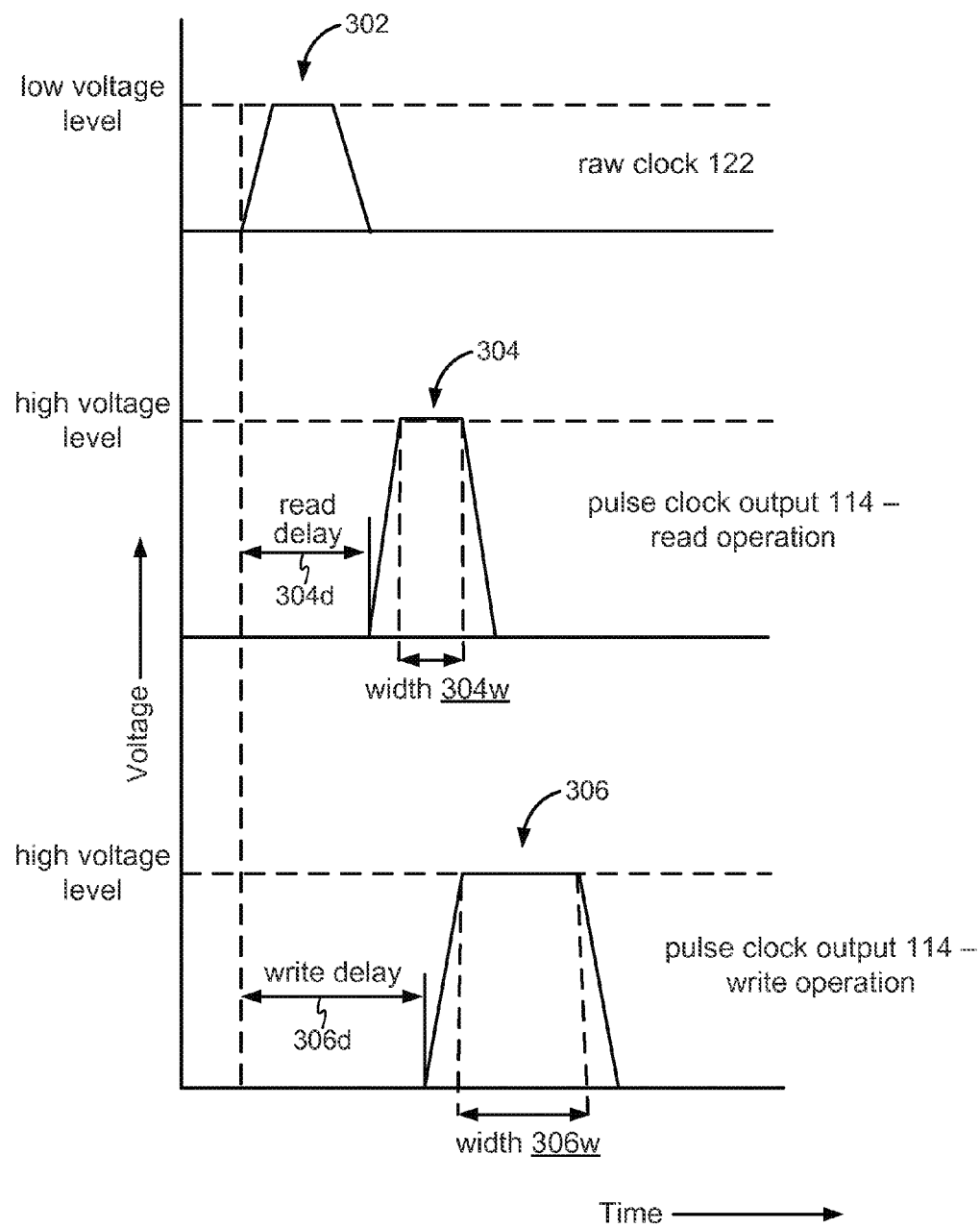
FIG. 3 illustrates a timing diagram comprising representations of pulse clocks pertaining to self-timed pulse clock generation circuit 100.

With reference now to FIG. 3, a timing diagram comprising exemplary schematic representations of raw clock 122 and ouptut pulse clock 114 for read and write operations as described above, is illustrated. The horizontal axis comprises time and the vertical axis comprises voltage levels as shown. Timing diagram 302 illustrates raw clock 122 at a low voltage level. As shown in timing diagram 304, output pulse clock 114 generated for a read operation is at a high voltage level and comprises a rising edge delay 304d; and as shown in timing diagram 306, output pulse clock 114 generated for a write operation is at a high voltage level and comprises a rising edge delay 306d. After expected read array delay is accounted for (e.g. through read delay mimic logic 108 of FIG. 1) rising edge delay 304d may be made as fast as required to meet the needs of a fast read operation. In comparison, rising edge delay 306d may not need to be fast and thus may be slowed down as required. Further, compared to timing diagram 304, timing diagram 306 illustrates pulse width 306w for a write operation to be wider than pulse width 304w for a read operation, in order to satisfy wider pulse width requirements of write operations as described above.

Figure 4:
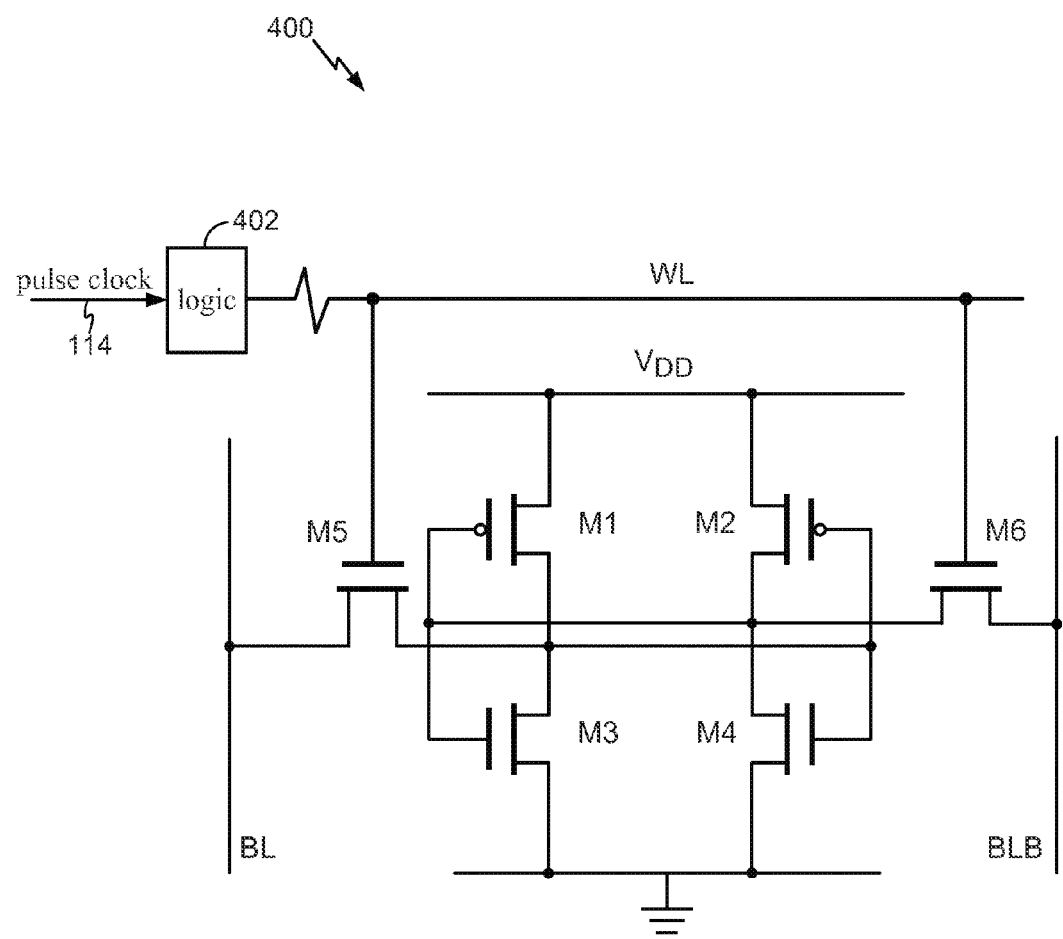
FIG. 4 illustrates a conventional 6T SRAM cell 400 to which a pulse clock generated according to exemplary embodiments may be applied.

With reference now to FIG. 4, conventional 6T SRAM cell 400 is illustrated to which output pulse clock 114 generated according to exemplary embodiments may be applied. As shown, output pulse clock 114 is used by logic components well known in the art, such as a word line decoder, generally designated by logic 402 in FIG. 4. The operation of 6T SRAM cell 400 is well known. Transistors M1, M2, M3, and M4 form a cross-coupled inverter storage element, while access transistors M5 and M6 control read/write operations for the storage element. Word line WL controls the gates of access transistors M5 and M6, while complementary bit lines BL and BLB are used to select the particular 6T SRAM cell 400 for write operations and to read out the stored value for read operations. As shown, output pulse clock 114 may be applied to word line WL in order to meet specific pulse clock requirements for read and write operations, as shown, for example, in FIG. 3.

It will be seen that with regard to write operations in exemplary embodiments, delays introduced by selective delay logic 102 may delay the rising edge of output pulse clock 114 during write operations, which again allows additional set up time for bit lines BL and BLB, and moreover may reduce power because accompanying buffers and drivers may be downsized. Further, the wider pulse width created by selective pulse width widening logic 110 may facilitate write operations even at lower voltage levels, which may lead to improved yield.

Additionally, integrating the voltage level shifting mechanism in pulse clock generation logic 112 may lead to lower latency and improved reuse of functional blocks, as compared to conventional implementations which have level shifters separated from pulse clock generation logic. The feedback path to built-in level shifter via pull-down transistors n3 and n4 may speed up the rising edge of output pulse clock 114 especially when the voltage difference between the low voltage level of raw clock 122 and the high voltage level of output pulse clock 114 is large. The latch mechanism in pulse clock generation logic 112 may additionally facilitate holding the logic state of output pulse clock 114 stable.

Figure 5:
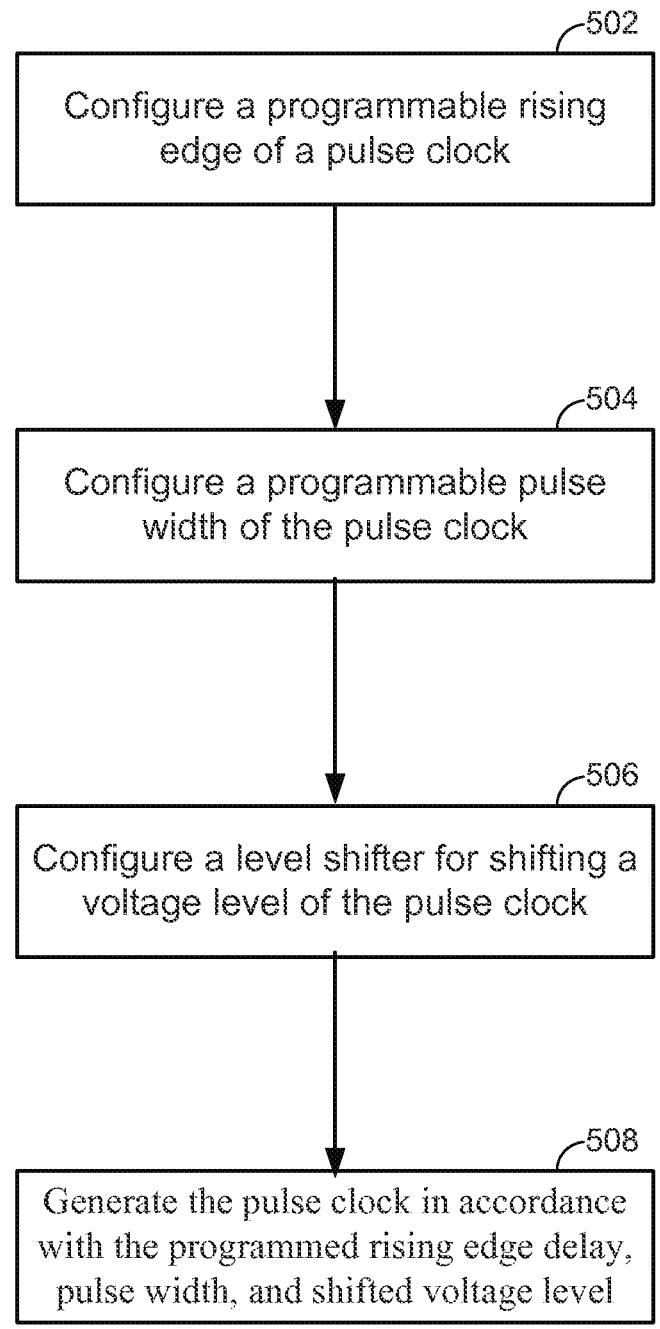
FIG. 5 is a flow chart representing an exemplary method of generating a pulse clock according to exemplary embodiments.

It will be appreciated that embodiments include various methods for performing the processes, functions and/or algorithms disclosed herein. For example, as illustrated in FIG. 5, an embodiment can include a method for generating a pulse clock (e.g. output pulse clock 114 of FIG. 1) comprising: configuring a programmable rising edge delay (e.g. rising edge delay 304d and 306d as illustrated in timing diagrams 304 and 306 of FIG. 3) of the pulse clock—Block 502; configuring a programmable pulse width (e.g. width 304w and 306w as illustrated in timing diagrams 304 and 306 of FIG. 3) of the pulse clock—Block 504; configuring a level shifter (e.g. built-in level shifter in pulse clock generation logic 112 of FIGS. 1-2) for shifting a voltage level of the pulse clock—Block 506; and generating the pulse clock in accordance with the programmed rising edge delay, pulse width, and shifted voltage level—Block 508.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Figure 6:
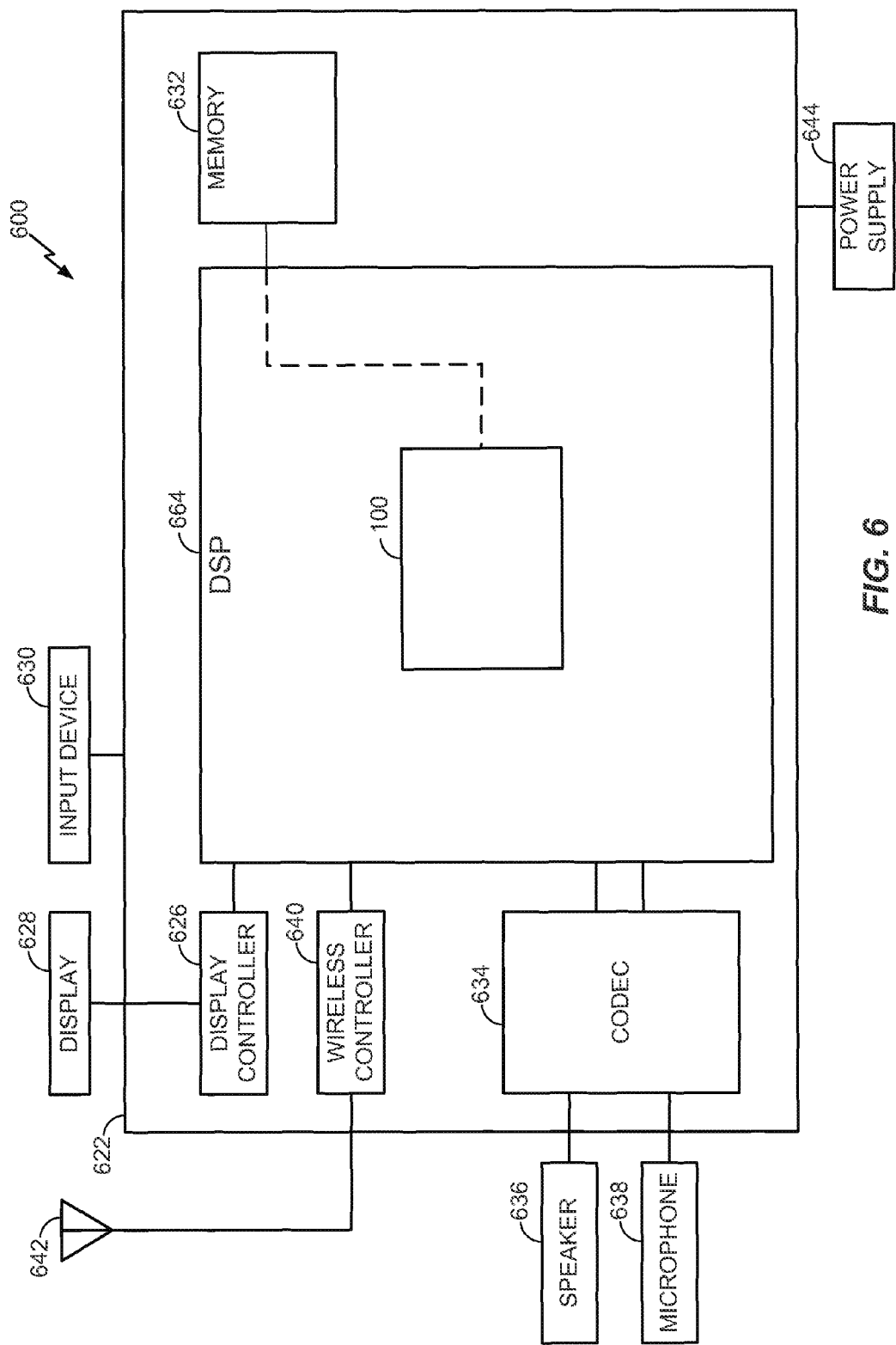
FIG. 6 illustrates an exemplary wireless communication system 600 in which an embodiment of the disclosure may be advantageously employed.

Referring to FIG. 6, a block diagram of a particular illustrative embodiment of a wireless device that includes a multi-core processor configured according to exemplary embodiments is depicted and generally designated 600. The device 600 includes a digital signal processor (DSP) 664, which may include self-timed pulse clock generation circuit 100 of FIG. 1. DSP 664 may be coupled to memory 632 as shown, wherein the generated pulse clock from self-timed pulse clock generation circuit 100 may be used for memory accesses on memory 632. For example, FIG. 6 also shows an external device such as display controller 626 that is coupled to DSP 664 and to display 628. An external device such as coder/decoder (CODEC) 634 (e.g., an audio and/or voice CODEC) can also be coupled to DSP 664. Other components/external devices, such as wireless controller 640 (which may include a modem) are also illustrated. Speaker 636 and microphone 638 can be coupled to CODEC 634. FIG. 6 also indicates that wireless controller 640 can be coupled to wireless antenna 642. In a particular embodiment, DSP 664, display controller 626, memory 632, CODEC 634, and wireless controller 640 are included in a system-in-package or system-on-chip device 622.

In a particular embodiment, input device 630 and power supply 644 are coupled to the system-on-chip device 622. Moreover, in a particular embodiment, as illustrated in FIG. 6, display 628, input device 630, speaker 636, microphone 638, wireless antenna 642, and power supply 644 are external to the system-on-chip device 622. However, each of display 628, input device 630, speaker 636, microphone 638, wireless antenna 642, and power supply 644 can be coupled to a component of the system-on-chip device 622, such as an interface or a controller.

It should be noted that although FIG. 6 depicts a wireless communications device, DSP 664 and memory 632 may also be integrated into a set-top box, a music player, a video player, an entertainment unit, a navigation device, a personal digital assistant (PDA), a fixed location data unit, or a computer. A processor (e.g., DSP 664) may also be integrated into such a device.

Accordingly, an embodiment of the invention can include a computer readable media embodying a method for generating a pulse clock with a built-in level shifter and a programmable rising edge and programmable pulse width. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for generating a pulse clock comprising:
    configuring a programmable rising edge delay of the pulse clock, from a raw clock;
    configuring a programmable pulse width of the pulse clock;
    configuring a level shifter for shifting a voltage level of the pulse clock; and
    generating the pulse clock in accordance with the programmed rising edge delay, programmed pulse width, and shifted voltage level.

2. The method of claim 1, comprising generating the pulse clock at a high voltage level from the raw clock at a low voltage level.

3. The method of claim 2, wherein a rising edge of the raw clock at the low voltage level is configured to generate a rising edge of a pulse clock in the high voltage level.

4. The method of claim 2, further comprising delaying the raw clock during a write operation to generate the rising edge delay of the pulse clock.

5. The method of claim 1, wherein the rising edge delay for a read operation is programmed to correspond to an expected read array access delay.

6. The method of claim 1, wherein the pulse width for a write operation is programmed to be wider than the pulse width for a read operation.

7. A pulse clock generation circuit for generating a pulse clock, the pulse clock generation circuit comprising:
    a selective delay logic to provide a programmable rising edge delay of the pulse clock;
    a selective pulse width widening logic to provide a programmable pulse width of the pulse clock;
    a built-in level shifter configured to shift a voltage level of the pulse clock; and
    logic configured to generate the pulse clock in accordance with the programmed rising edge delay, programmed pulse width, and shifted voltage level.

8. The pulse clock generation circuit of claim 7, wherein the pulse clock is generated in a high voltage domain from a raw clock in a low voltage domain.

9. The pulse clock generation circuit of claim 8, wherein a rising edge of the raw clock at the low voltage domain is configured to generate a rising edge of the pulse clock in the high voltage domain.

10. The pulse clock generation circuit of claim 8, wherein the selective pulse width widening logic is configured to delay the raw clock during a write operation to generate the rising edge delay of the pulse clock.

11. The pulse clock generation circuit of claim 7, wherein a read delay mimic logic is configured to provide a programmable delay to the rising edge of the pulse clock for a read operation, wherein the programmable delay matches an expected delay for a read array access.

12. The pulse clock generation circuit of claim 7, wherein the selective pulse width widening logic is configured to generate a pulse width for a write operation that is wider than the pulse width for a read operation.

13. The pulse clock generation circuit of claim 7, further comprising an input reset signal configured to drive the pulse clock to low logic level.

14. The pulse clock generation circuit of claim 7, further comprising a latch to stabilize the pulse clock.

15. The pulse clock generation circuit of claim 14, further comprising pull-up transistors to reduce charge sharing created by the latch.

16. The pulse clock generation logic of claim 7, further comprising an input enable signal to enable pulsing behavior of the pulse clock.

17. The pulse clock generation logic of claim 16, wherein the input enable signal is configured to enable pulsing behavior of the pulse clock for a plurality of clock cycles corresponding to the time period for completion of a memory access operation.

18. The pulse clock generation logic of claim 7 integrated in a semiconductor die.

19. The pulse clock generation logic of claim 7, integrated into a device selected from the group consisting of a set top box, music player, video player, entertainment unit, navigation device, communications device, personal digital assistant (PDA), fixed location data unit, and a computer.

20. A pulse clock generation system for generating a pulse clock, the pulse clock generation system comprising:
- a selective delay means for providing a programmable rising edge delay of the pulse clock;
- a selective pulse width widening means for providing a programmable pulse width of the pulse clock;
- a built-in level shifting means for shifting a voltage level of the pulse clock; and
- means for generating the pulse clock in accordance with the programmed rising edge delay, programmed pulse width, and shifted voltage level.

21. A non-transitory computer-readable storage medium comprising code, which, when executed by a processor, causes the processor to perform operations for programming a pulse clock generator, the non-transitory computer-readable storage medium comprising:
- code for configuring a programmable rising edge delay of the pulse clock, from a raw clock;
- code for configuring a programmable pulse width of the pulse clock;
- code for configuring a level shifter for shifting a voltage level of the pulse clock; and
- code for generating the pulse clock in accordance with the programmed rising edge delay, pulse width, and shifted voltage level.

* * * * *